United States Patent [19]
Concorso

[11] Patent Number: 5,302,917
[45] Date of Patent: Apr. 12, 1994

[54] LINEAR AMPLIFIER CIRCUIT FOR AUDIO EQUIPMENT

[76] Inventor: James A. Concorso, 1007 Rector Rd., Bridgewater Township, Somerset County, N.J. 08807-1317

[21] Appl. No.: 17,512

[22] Filed: Feb. 12, 1993

[51] Int. Cl.$^5$ .............................................. H03F 3/26
[52] U.S. Cl. .................................... 330/264; 330/267
[58] Field of Search ................. 330/69, 255, 264, 267, 330/269; 381/120, 121

[56] References Cited

U.S. PATENT DOCUMENTS

| | | | |
|---|---|---|---|
| Re. 31,749 | 11/1984 | Yamashiro | 330/264 |
| 4,464,634 | 8/1984 | Velazquez | 330/264 |
| 4,467,288 | 8/1984 | Strickland | 330/149 |
| 4,483,016 | 11/1984 | Hochstein et al. | 381/120 |
| 4,743,850 | 5/1988 | Dziagwa | 330/251 |
| 4,888,559 | 12/1989 | Sevenhans et al. | 330/264 X |
| 5,162,753 | 11/1992 | Khorramabadi | 330/264 |

OTHER PUBLICATIONS

Reinhard Metz & Myzil Boyce, "High Power Hi-Fi Audio Amp For Your Car", *Radio Electronics*, Apr., 1992, vol. 63, No. 4, p. 31 et seq.

*Primary Examiner*—Steven Mottola
*Attorney, Agent, or Firm*—Kenneth P. Glynn

[57] ABSTRACT

The present invention amplifier circuit for connection to input and output devices, e.g. speakers includes input amplifier; positive power supply input; negative power supply input; first bias input means; second bias input means; a first differentiator/summer, receiving signals from the input amplifier, from the positive power supply input and from the first bias input means; a second differentiator/summer, receiving signals form the input amplifier, from the negative power supply input and from the second bias input means. There are PMOS and NMOS devices receiving signals from respective differentiator/summers, receiving power form the positive and negative power supply inputs and receiving signals from respective A. C. signal paths. Thus, there are first and second A. C. signal paths, each receiving signals from the input amplifier and sending resultant signals to the PMOS and NMOS devices, respectively; and an output terminal receiving signals from said PMOS and NMOS devices. Each differentiator/summer acts to assure that the gate tracks the source of its MOS device so that the gate-source potentials of the MOS devices are unaffected by changes in the potential of the power supply; and they send signals to the MOS devices respectively only upon potential differences in signals between the bias input means and the input amplifier signals. The first A. C. signal path and the second A. C. signal path provide parallel paths to the MOS device respectively to bypass the differentiator/summers, when signals from the input amplifier exceed a preset frequency.

20 Claims, 2 Drawing Sheets

LINEAR AMPLIFIER CIRCUIT FOR AUDIO EQUIPMENT

BACKGROUND OF THE INVENTION

1. Field of the Invention

The present invention relates to an amplifier circuit in which all of the advantages of power MOSFETs are realized without compromise. It is directed to an amplifier circuit of the common source push-pull output stage with MOSFETs and with enhanced efficiency based on support controlling components for high-frequency and low-frequency signals.

2. Information Disclosure Statement

Audio amplification has been evolving for decades and, with the advent of newer and better electronic components, improved amplifiers move in the direction of what sounds to the human ear to approach perfection. Nonetheless, various new problems arise from enhanced designs and in the inclusion of newly developed electronic components. The following background information and prior art is exemplary of the evolution of audio amplifiers to the present day.

Linear power amplifiers, such as those used in audio amplifiers, traditionally employ an output stage of what is known as the push-pull configuration. In such a configuration, a pair of semiconductor devices is arranged in a series fashion between a positive power supply feed and a negative power supply feed. The point at which the two semiconductor devices adjoin serves as the output terminal. The semiconductor devices are then driven so as to alternately conduct, thus causing the potential at the output node to rise and fall between the two power supply connections.

MOS transistors (Metal Oxide Semiconductor) are frequently used in a push-pull linear output stage. The MOS device has three electrodes: a gate terminal for receiving a controlling signal, a source terminal for establishing a return path for said controlling signal, and a drain terminal for establishing a conductive path to the source terminal; the degree of conductivity being controlled by said controlling signal. Significant quantities of capacitance exist between these electrodes; the controlling signal must charge and discharge these capacitances to modulate the conductivity of the path existing between the source and drain electrodes.

Returning to the discussion of the push-pull linear output stage, a MOS device of a positive type (PMOS) and a MOS device of a negative type (NMOS) are generally used; the contrary nature of their electrode polarities facilitate implementation in the push-pull configuration. There are two ways of arranging this connection. One is the "source follower" configuration. In this implementation, the source terminals of the respective PMOS and NMOS transistors are interconnected to form the output node. Positive power is fed to the drain terminal of the NMOS device, and negative power is fed to the drain terminal of the PMOS device. The chief drawback to this configuration is that as the output potential is modulated the source terminals "follow" the modulation, hence upsetting the potential difference between the source and gate terminals. Such a configuration requires that the drive signal potential exceed the desired output potential in both the positive and negative direction. This is necessary to insure that sufficient potential difference exists between the gate and source terminals to sustain conductivity from drain to source.

The advantage of this configuration is that the above-described "bootstrapping" phenomenon lessens the burden which the interelectrode capacitances pose on the driver stage. Another benefit is that the potential existing between the gates of the respective MOS devices is of a relatively small magnitude, making it easy to establish a single path to both gates; a necessary step in completing the circuit architecture. Hence, speed and linearity are enhanced.

The second way of arranging the push-pull connection is known as the "common source" configuration. In this implementation, the drain terminals of the respective PMOS and NMOS transistors are interconnected to form the output node. Positive power is fed to the source terminal of the PMOS device, and negative power is fed to the source terminal of the NMOS device. The bootstrapping phenomenon exhibited by the source follower arrangement is eliminated, because excitation of the common source output stage does not cause a corresponding disruption of the source terminal potentials of the respective MOS devices. Hence, relatively small signal potentials are sufficient to cause large output modulations.

The chief drawback is that the interelectrode capacitances of the MOS devices are not bootstrapped, and pose a significant burden on the driver stage. Furthermore, a large potential exists between the gate terminals of the MOS devices, making it difficult to establish a single path to both gates. These drawbacks tend to compound one another, since the driver stage is burdened by both the current requirement and the potential difference between the MOS gates. Consequently, speed and linearity are diminished.

U.S. Pat. No. 4,464,634, issued to Juan F. Velezquez, describes an "Audio Power Amplifier", which utilizes an input amplifier stage and an output amplifier stage. The output power amplifier stage utilizes a P-channel MOSFET and an N-channel MOSFET having interconnected drain electrodes forming an output signal terminal. A driver circuit is provided which operates in a transconductance mode wherein the output current through the MOSFETs is directionally proportional to the input voltage applied to the output amplifier stage. Feedback paths are used between the output power amplifier stage and the input amplifier stage as well as between the output and input of the input amplifier stage.

U.S. Pat. No. 4,467,288, issued to James C. Strickland, describes an amplifier utilizing an input amplifier, an output amplifier and a cooperative combination of negative and positive feedback loops that removes substantially all distortion and error in the amplified output, according to the inventor. Negative feedback loops are provided around the output amplifier and the input/output amplifier combination to provide degenerative error reduction. The negative feedback loop around the MOSFET output stage identifies the error component and inversely superposes an inverted signal. In other words, the precorrection is precisely controlled to effect virtually complete serial cancellation of the to-be-introduced error as the signal is propagated through the amplifier.

U.S. Pat. No. 4,483,016, issued to Peter A. Hochstein and Kelvin Shih, describes an "Audio Amplifier", using a differential amplifier stage, a primary amplification stage, bipolar supply connections for supplying electric current, the primary amplification stage including at least two MOSFETs in common source connection between the power supply connections and a circuit transducer output, along with a level shifting driver stage connected to ground.

U.S. Pat. No. Re. 31,749, which is a reissue of a U.S. Pat. No. 4,100,502, issued to Osamu Yamashiro, describes an amplifier circuit with a complementary inverter which includes a P-channel metal-insulator-semiconductor FET connected to a first source potential, an N-channel metal-insulator-semiconductor FET connected to a second source potential with the gate of the two FETs with a common linear input, respective load resistors connected to the drains of the FETs, an output being derived from the interconnection of the load resistors or from the drains of the FETs, and a bias resistor between the gate and the drain of each of the complementary FETs, the input being supplied to the gate of the FETs through respective capacitors. The FETs are individually biased so that the circuit may serve as a Class B push-pull amplifier of low power consumption.

U.S. Pat. No. 4,743,860, issued to James M. Dziagwa, sets forth a power amplifier circuit having a first and second series of capacitors with a junction between them which are coupled across a floating, double ended power supply. A speaker is coupled between the junction and the ground and first and second complementary conductivity power MOSFETs are connected between a first power supply output and a ground and between a second power supply output and a ground, respectively. The MOSFETs are driven by an amplified audio input signal and alternatively connect to one or the other supply output to ground to alternately charge and discharge the capacitors, causing alternating current to flow through the speaker.

An article in Volume 63, Number 4 of *Radio Electronics*, April, 1992, entitled "High Power Hi-Fi Audio Amp For Your Car", at Page 31 et seq., describes an audio amplifier in which output swings of an operational amplifier drive a current source and a current sink for the purpose of translating and applying said output swings to an NPN transistor and a PNP transistor, respectively. The voltage drop between the bases of said NPN and said PNP transistor are determined by a voltage multiplier. FET output transistors are then driven into conduction by said NPN transistor and said PNP transistor.

Notwithstanding the above prior art and the state-of-the-art as understood, it appears that the present invention concept wherein capacitors are used as a high-frequency signal path and a separate path is provided for the low-frequency signal component with D. C. bias, by its own circuit, is neither taught nor suggested.

SUMMARY OF THE INVENTION

The present invention amplifier circuit is for connection to an input source and to one or more output devices, such as one or more speakers. It includes an input amplifier, a positive power supply input, a negative power supply input, a first bias input means, and a second bias input means. It also includes a first differentiator/summer, receiving signals from the input amplifier, receiving signals from the positive power supply input and receiving signals from the first bias input means, as well as a second differentiator/summer, receiving signals from the input amplifier, receiving signals from the negative power supply input and receiving signals from the second bias input means. There is a PMOS device, receiving signals from the first differentiator/summer, receiving power from the positive power supply input and receiving signals from a first A. C. signal path, as well as an NMOS device, receiving signals from the second differentiator/summer, receiving power from the negative power supply input and receiving signals from a second A. C. signal path. It further includes a first A. C. signal path, receiving signals from the input amplifier and sending resultant signals to the PMOS device, and a second A. C. signal path, receiving signals from the input amplifier and sending resultant signals to the NMOS device, as well as an output terminal receiving signals from said PMOS device and said NMOS device. The first differentiator/summer and the second differentiator/summer act to assure that the gate tracks the source of the PMOS device and that the gate tracks the source of the NMOS device respectively so that the respective gate-source potentials of the PMOS device and the NMOS device are unaffected by changes in the potential of the power supply, and they act to send signals to the PMOS device and the NMOS device respectively only upon potential differences in signals between the bias input means and the input amplifier signals. They may also act to maintain an idle bias, as desired. The first A. C. signal path and the second A. C. signal path provide parallel paths to the PMOS device and the NMOS device respectively to bypass the differentiator/summers, when signals from the input amplifier exceed a preset frequency.

BRIEF DESCRIPTION OF THE DRAWINGS

The present invention as described in the specification herein is more fully understood when taken in conjunction with the drawings appended hereto.

Thus.

DETAILED DESCRIPTION OF THE PRESENT INVENTION

Figure 1:
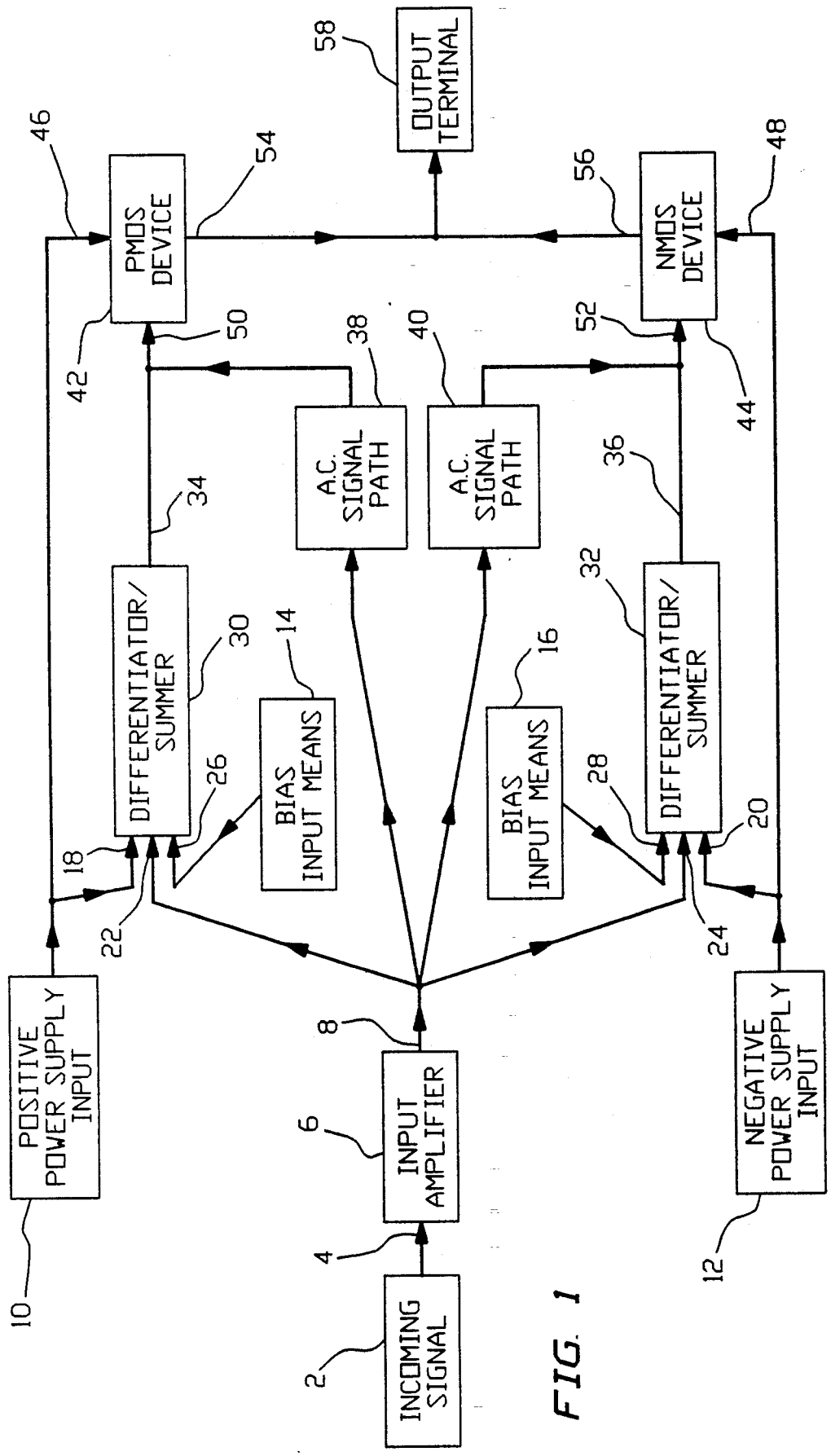
FIG. 1 shows a generic block diagram of the present invention amplifier circuit; and, FIG. 2 shows a schematic diagram of a preferred embodiment amplifier circuit of the present invention.

The present invention relates to an amplifier circuit, especially useful as an audio amplifier, in which all of the advantages of power MOS devices, and especially MOSFETs (metal oxide semiconductor field effect transistors) are realized without compromise. A brief description of the concepts follows:

A MOSFET device embodies interelectrode capacitances which must be charged and discharged by a driver circuit. In a conventional MOSFET amplifier, gate charge/discharge current is supplied by a driver transistor during one half of the audio cycle, and by a passive resistance during the other half. Said resistance forms a time constant with the MOSFET interelectrode capacitances which ultimately limits the operating speed of the amplifier. Because the driver is a single-ended Class-A stage, a tradeoff must be made between output stage speed and driver stage power dissipation. The performance advantages for which MOSFETs were selected in the first place are negated in such a design.

It is well known that Class-A power dissipation in the driver stage can be virtually eliminated by using capacitors to couple the drive signal to the output stage. The benefits of capacitive coupling can best be realized in a common source output stage; a configuration wherein its greater-than-unity voltage gain poses a relatively miniscule drive voltage requirement. Unfortunately, the common source output stage exhibits three difficulties when implemented with capacitive coupling. The first is the shoot-through current which can destroy the output stage during power-up, when the coupling capacitors charge and turn on the MOSFETs simultaneously. This anomaly can also occur during a sudden increase of supply potential. The second problem is that the amplifier's frequency response does not extend to zero hertz. The third problem is providing a means for regulating the idle bias potentials applied to the output stage devices while at the same time allowing the driver stage to control the D. C. potential at the output terminal. This has been a formidable obstacle in a common source output stage, for a very large potential exists between the gates of the output devices.

In the present invention, the capacitive coupling technique is successfully implemented by using capacitors only as a high-frequency signal path; the time constant of this path is thus too small to provoke shoot-through current. A separate path for the low-frequency signal component and D. C. bias is provided by a special circuit.

Audiophiles frequently place great importance on having "no capacitors in the signal path." However, excluding the optional servo (discussed below), an amplifier of the present invention exhibits a frequency response which remains flat all the way down to zero hertz.

Furthermore, in a MOSFET audio amplifier, the interelectrode capacitance of the output devices will always form the dominant high frequency pole with the output impedance of the driver stage. Therefore, capacitive coupling places the present invention at a great advantage compared to traditional designs, where a tradeoff is invariably made between maximum operating speed and driver stage power dissipation. An audio amplifier of the present invention affords more freedom from the deleterious effect of capacitive reactance than the so-called "direct coupled" MOSFET amplifier.

The present invention amplifier circuit is for connection to an input source and to an output, such as one or more speakers or other output devices. It includes an input amplifier, a positive power supply input, a negative power supply input, a first bias input means, a second bias input means, a first differentiator/summer, receiving signals from said input amplifier, receiving signals from said positive power supply input and receiving signals from said first bias input means, a second differentiator/summer, receiving signals from said input amplifier, receiving signals from said negative power supply input and receiving signals from said second bias input means, a PMOS device, receiving signals from said first differentiator/summer, receiving power from said positive power supply input and receiving signals from a first A. C. signal path set forth below, an NMOS device, receiving signals from said second differentiator/summer, receiving power from said negative power supply input and receiving signals from a second A. C. signal path set forth below, a first A. C. signal path, receiving signals from said input amplifier and sending resultant signals to said PMOS device, a second A. C. signal path, receiving signals from said input amplifier and sending resultant signals to said NMOS device; and, an output terminal receiving signals from said PMOS device and said NMOS device; wherein said first differentiator/summer and said second differentiator/summer acts to assure that the gate tracks the source of the PMOS device and that the gate tracks the source of the NMOS device respectively so that the respective gate-source potentials of the PMOS device and the NMOS device are unaffected by changes in the potential of the power supply, and act to send signals to the PMOS device and the NMOS device respectively only upon potential differences in signals between the bias input means and the input amplifier signals, and act to maintain an idle bias, as desired; and, wherein said first A. C. signal path and said second A. C. signal path provide parallel paths to said PMOS device and said NMOS device respectively to bypass said differentiator/summers, when signals from said input amplifier exceed a preset frequency. In preferred embodiments, the output is achieved from a common source push-pull output stage having a P-channel enhancement mode MOSFET and an N-channel mode MOSFET and has output connection for attachment to an output device. The reference potential generator, in one preferred embodiment, utilizes a single reference device to bias the output stage MOSFET symmetrically. Thus, in one embodiment, the single reference potential device has manual adjustability with a variable resistor. Also, in a preferred embodiment, the single reference device has temperature variation compensation based on temperature dependent changes of the MOS devices using an NPN bipolar transistor. In a preferred embodiment, the reference potential device includes both a single variable resistor as well as an NPN bipolar transistor. Where two reference devices are used, a separate bipolar transistor is connected to a heat sink for each MOS device to enhance stabilization of the output stage idle current against temperature changes. Further, the A. C. signal paths include coupling capacitors which protect the output MOSFETs against simultaneous conduction by synchronizing the signals applied thereto. The output MOSFETs may include zener diodes in preferred embodiments and these are connected to the output MOSFETs so as to limit excessive drive signals to the MOSFETs.

Referring to the block diagram of FIG. 1, an amplifier of the present invention comprises an input amplifier 6, for processing incoming signal 2, having an input 4 and an output 8. Output 8 of input amplifier 6 is connected to differentiator/summer 30 via input 22 and to differentiator/summer 32 via input 24. Positive power supply input 10 feeds input 18 of differentiator/summer 30 and also feeds source 46 of PMOS device 42. Negative power supply input 12 feeds input 20 of differentiator/summer 32 and also feeds source 48 of NMOS device 44. Output 34 of differentiator/summer 30 is connected to gate 50 of PMOS device 42. Output 36 of differentiator/summer 32 is connected to gate 52 of NMOS device 44. Drain 54 of PMOS device 42 and drain 56 of NMOS device 44 interconnect and feed output terminal 58. A. C. signal path 38 is connected from output 8 of input amplifier 6 to gate 50 of PMOS device 42, bypassing differentiator/summer 30 at high frequencies. Likewise, A. C. signal path 40 is connected from output 8 of input amplifier 6 to gate 52 of NMOS device 44, bypassing differentiator/summer 32 at high frequencies.

Observing differentiator/summer 30, when zero potential difference appears between input 22 and input 26, output 34 is responsive to input 18 so as to cause gate 50 of PMOS device 42 to be at the same potential as source 46 of same. Hence, no potential difference exists between gate 50 and source 46, and PMOS device 42 is in the "off" state. This occurs without regard to the magnitude of supply potential, since any deviation of said potential seen at source 46 will be duplicated at gate 50 as output 34 responds to input 18, thus maintaining a zero potential difference between source 46 and gate 50.

Observing now differentiator/summer 32, when zero potential difference appears between input 24 and input 28, output 36 is responsive to input 20 so as to cause gate 52 of NMOS device 44 to be at the same potential as source 48 of same. Hence, no potential difference exists between gate 52 and source 48, and NMOS device 44 is in the "off" state. This occurs without regard to the magnitude of supply potential, since any deviation of said potential seen at source 48 will be duplicated at gate 52 as output 36 responds to input 20, thus maintaining a zero potential difference between source 48 and gate 52.

Observing again differentiator/summer 30, a potential exerted upon input 22 relative to input 26 is algebraically added to the existing potential at output 34 so as to establish a D. C. signal path from output 8 of input amplifier 6 to gate 50 of PMOS device 42. Observing again differentiator/summer 32, a potential exerted upon input 24 relative to input 28 is algebraically added to the existing potential at output 36 so as to establish a D. C. signal path from output 8 of input amplifier 6 to gate 52 of NMOS device 44.

When the potential at output 8 of input amplifier 6 increases in the positive direction relative to input 26, output 34 of differentiator/summer 30 causes the potential at gate 50 of PMOS device 42 to increase in the positive direction, resulting in a decrease in conductivity across source 46 and drain 54 of PMOS device 42. At the same time, when the potential at output 8 of input amplifier 6 increases in the positive direction relative to input 28, output 36 of differentiator/summer 32 causes the potential at gate 52 of NMOS device 44 to increase in the positive direction, in this case resulting in an increase in conductivity across source 48 and drain 56 of NMOS device 44. Hence, the potential at output terminal 58 increases in the negative direction.

When the potential of output 8 of input amplifier 6 increases in the negative direction relative to input 26, output 34 of differentiator/summer 30 causes the potential at gate 50 of PMOS device 42 to increase in the negative direction, resulting in an increase in conductivity across source 46 and drain 54 of PMOS device 42. At the same time, when the potential at output 8 of input amplifier 6 increases in the negative direction relative to input 28, output 36 of differentiator/summer 32 causes the potential at gate 52 of NMOS device 44 to increase in the negative direction, in this case resulting in a decrease in conductivity across source 48 and drain 56 of NMOS device 44. Hence, the potential at output terminal 58 increases in the positive direction.

It can be seen that when output 8 of input amplifier 6 is at zero potential relative to input 26 of differentiator/summer 30, PMOS device 42 is in the "off" state, and when output 8 of input amplifier 6 is at zero potential relative to input 28 of differentiator/summer 32, NMOS device 44 is in the "off" state. However, in applications where a highly linear transfer function is of importance, such as an audio amplifier, it is common practice to allow some degree of current to flow through both output devices simultaneously during the no-signal condition. In this way, as the output potential modulates, there is never an instant when both devices are in the "off" state. Thus, no glitch occurs during the transitional or crossover period from the conduction cycle of one device to the conduction cycle of the other.

Referring to differentiator/summer 30, a potential exerted upon input 26 via bias input means 14 relative to input 22 is algebraically subtracted from the existing potential at output 34. A D. C. path is thus provided from bias input means 14 to gate 50 of PMOS device 42, and can be used to cause a desired level of conductivity of PMOS device 42 when no incoming signal 2 is present.

Referring now to differentiator/summer 32, a potential exerted upon input 28 via bias input means 16 relative to input 24 is algebraically subtracted from the existing potential at output 36. A D. C. path is thus provided from bias input means 16 to gate 52 of NMOS device 44, and can be used to cause a desired level of conductivity of NMOS device 44 when no incoming signal 2 is present.

An optional servo-controlled offset null circuit may be included in the amplifier circuit of the present invention.

It should be noted that auxiliary power supply rails are used in preferred embodiments and connected to the reference potential generator to optimize the use of the components therein.

It should be further noted that the use of "low frequency" and "high frequency" herein are relative terms; the exact crossover between low frequency and high frequency is a matter of design. Thus, the crossover frequency may be 100 hertz or even lower. On the other hand, a crossover frequency anywhere from 100 hertz to 100 kilohertz or higher may well be reasonable. The actual crossover frequency will depend upon the quality of the various components which will in part be based upon the expense of such components as well as their availability. For example, if the operational amplifiers employed in the differentiator/summers have a slew rate of 0.25 volts per microsecond, then 5 to 10 kilohertz as the crossover from low-frequency to high-frequency might be acceptable. In other words, the actual crossover between low-frequency and high-frequency is arbitrary within a broad range. Also, it should be noted that a mid-range frequency path which might bypass either the low-frequency frequency path or the high-frequency path or both could be included in the amplifier circuit of the present invention without exceeding its scope.

Figure 2:
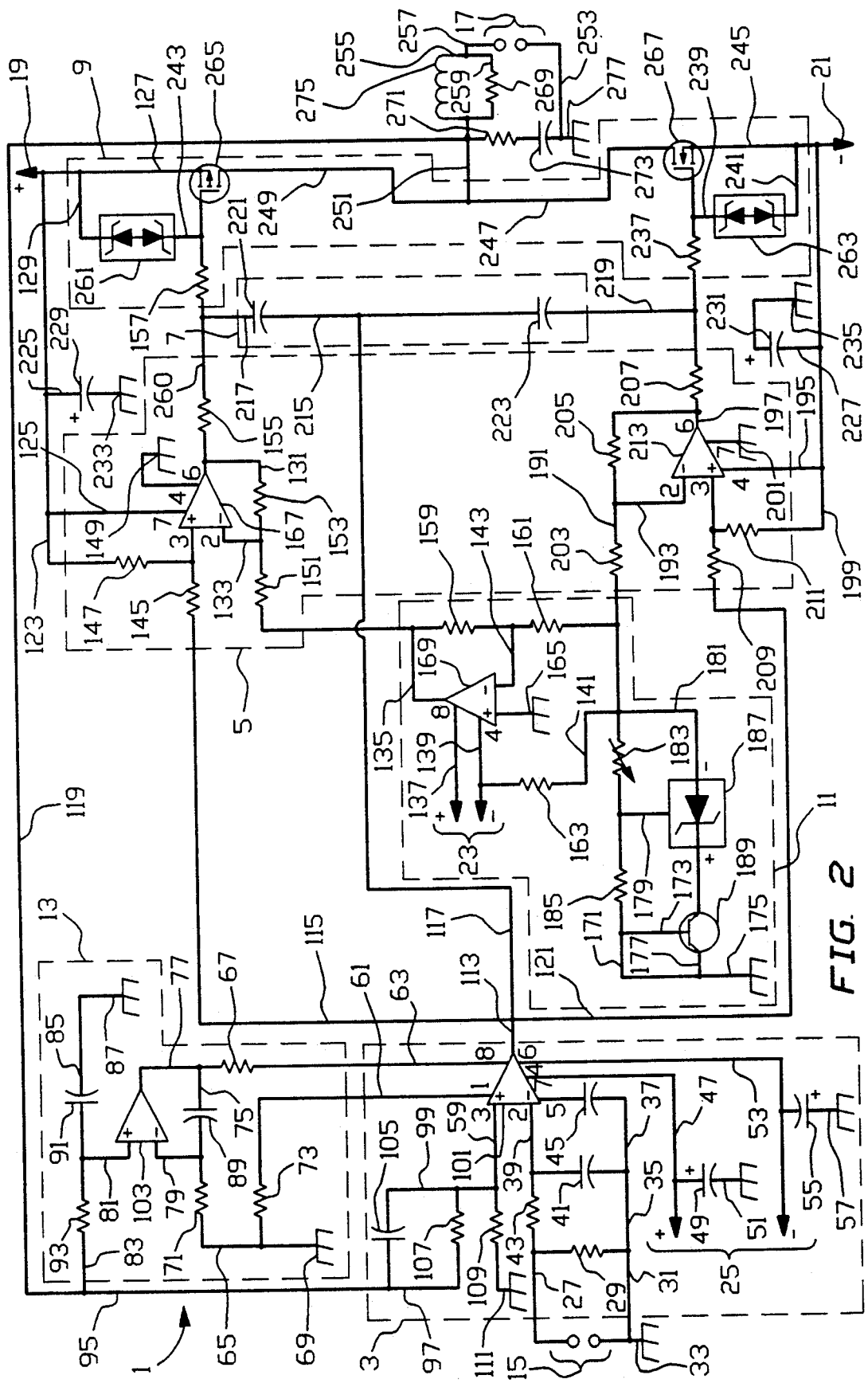

FIG. 2 shows a schematic diagram of a preferred embodiment of the present invention amplifier circuit including various optional characters. All individual devices and components and all conductive paths are numbered. So as to avoid repetitiveness and to not reiterate sentence by sentence the connective relationships among all of the referenced elements in FIG. 2, the following Table 1 describes all elements shown in FIG. 2 by numeral and description. Significant detail follows Table 1, discussing the relationships of all of the functional components and devices without enumerating the now self-evident conductive paths shown in FIG. 2.

TABLE 1

| Reference No. | Item (Values) |
| --- | --- |
| 1 | Audio Amplifier Circuit |
| 3 | Input Amplifier Sector |
| 5 | Differentiator/Summer Sectors |
| 7 | A.C. Signal Sectors |
| 9 | MOS Device Sectors |
| 11 | Reference Potential Generator |

TABLE 1-continued

| Reference No. | Item (Values) |
|---|---|
| 13 | Optional Servo |
| 15 | Input Terminal |
| 17 | Output Terminal |
| 19 | Positive Fundamental Power Supply Rail |
| 21 | Negative Fundamental Power Supply Rail |
| 23 | Optional Auxiliary Power Supply Rails |
| 25 | Optional Auxiliary Power Supply Rails |
| 27,31,35,37,39 | Conductive Paths |
| 47,53,59,61,63 | Conductive Paths |
| 65,75,77,79,81 | Conductive Paths |
| 83,85,95,97,99 | Conductive Paths |
| 113,115,117,119 | Conductive Paths |
| 121,123,125,127 | Conductive Paths |
| 129,131,133,135 | Conductive Paths |
| 137,139,141,143 | Conductive Paths |
| 171,173,177,179 | Conductive Paths |
| 181,191,193,195 | Conductive Paths |
| 197,199,215,217 | Conductive Paths |
| 219,225,227,239 | Conductive Paths |
| 241,243,245,247 | Conductive Paths |
| 249,251,253,255 | Conductive Paths |
| 257,259,260 | Conductive Paths |
| 29 | Resistor (10K ohms) |
| 33 | Ground |
| 41 | Capacitor (100 pF, 500 volts) |
| 43 | Resistor (100 ohms) |
| 45 | Capacitor (15 pF, 500 volts) |
| 49 | Capacitor (330 µF, 20 volts) |
| 51 | Ground |
| 55 | Capacitor (330 µF, 20 volts) |
| 57 | Ground |
| 67 | Resistor (10K ohms) |
| 69 | Ground |
| 71 | Resistor (1M ohms) |
| 73 | Resistor (10K ohms) |
| 87 | Ground |
| 89 | Capacitor (0.1 µf, 250 volts) |
| 91 | Capacitor (0.1 µf, 250 volts) |
| 93 | Resistor (1M ohms) |
| 101 | Operational Amplifier |
| 103 | Operational Amplifier |
| 105 | Capacitor (22 pF, 500 volts) |
| 107 | Resistor (1.9K ohms) |
| 109 | Resistor (100 ohms) |
| 111 | Ground |
| 145 | Resistor (100K ohms) |
| 147 | Resistor (100K ohms) |
| 149 | Ground |
| 151 | Resistor (100K ohms) |
| 153 | Resistor (100K ohms) |
| 155 | Resistor (180 ohms) |
| 157 | Resistor (20 ohms) |
| 159 | Resistor (100K ohms) |
| 161 | Resistor (100K ohms) |
| 163 | Resistor (10K ohms) |
| 165 | Ground |
| 167 | Operational Amplifier |
| 169 | Operational Amplifier |
| 175 | Ground |
| 183 | Variable Resistor (0 ohms to 200K ohms) |
| 185 | Resistor (100K ohms) |
| 187 | Adjustable Voltage Reference Device |
| 189 | NPN Bipolar Transistor |
| 201 | Ground |
| 203 | Resistor (100K ohms) |
| 205 | Resistor (100K ohms) |
| 207 | Resistor (180 ohms) |
| 209 | Resistor (100K ohms) |
| 211 | Resistor (100K ohms) |
| 213 | Operational Amplifier |
| 221 | Capacitor (0.1 µf, 250 volts) |
| 223 | Capacitor (0.1 µf, 250 volts) |
| 229 | Capacitor (470 µf, 50 volts) |
| 231 | Capacitor (470 µf, 50 volts) |
| 233 | Ground |
| 235 | Ground |
| 237 | Resistor (20 ohms) |
| 261 | Bi-directional Zener Diode |
| 263 | Bi-directional Zener Diode |
| 265 | P-channel MOSFET |
| 267 | N-channel MOSFET |
| 269 | Resistor (7.5 ohms) |
| 271 | Resistor (7.5 ohms) |
| 273 | Capacitor (0.1 µf, 250 volts) |
| 275 | Air Coil Inductor (1.8 µH) |
| 277 | Ground |

A schematic diagram depicting the preferred embodiment of the present invention amplifier 1 is, as mentioned, shown in FIG. 2. Primary power is provided to the circuit by means of a pair of fundamental power supply rails 19 and 21; rail 19 exhibiting a potential of a positive polarity with respect to circuit ground; rail 21 exhibiting a potential of a negative polarity with respect to circuit ground. The present circuit optionally includes a pair of auxiliary power supply rails, one exhibiting a potential of a positive polarity with respect to circuit ground; the other exhibiting a potential of negative polarity with respect to circuit ground. Said auxiliary supply rails provide potentials of a relatively low magnitude for those circuit components which need not operate on the high potentials of the fundamental power supply rails 19 and 21.

Operational amplifier 101 is provided for the purpose of establishing a high open-loop gain factor within the signal path of the present invention. Said device 101 is powered with its positive supply input terminal connected to the positive rail of auxiliary power supply 25, and its negative supply input terminal connected to the negative rail of auxiliary power supply 25. (It should be noted that although auxiliary power supplies 23 and 25 are shown at separate locations in FIG. 2, in preferred embodiments, they are one in the same auxiliary power supply.)

Resistor 29 is connected from the input terminal of the present invention amplifier 1 to circuit ground 33, providing a return for the input bias current of driver amplifier 101 and defining the input resistance of the present invention amplifier 1. Resistor 43 connects the input terminal 15 of the present invention amplifier 1 to the inverting input terminal of driver amplifier 101. Capacitor 41 is connected from said inverting input terminal to circuit ground 33. 41 and 43 form a slew-limiting filter at the input terminal 15 of the present invention amplifier 1. The open-loop gain of driver amplifier 101 is set by capacitor 45, connected between the frequency compensation terminal of said driver amplifier 101 and circuit ground 33.

The need for MOS output device bias regulation is important. The transconductance of power MOSFET devices is so high, the total gate-source potential required during idle is only a few tens of millivolts greater than the gate threshold potential. This means that without bias regulation, relatively small fluctuations in supply potential will cause huge changes in output stage idle current.

The difficulty in regulating the output bias arises from the fact that a MOSFET is biased by disposing a potential across the device's gate and source terminals, and it is the MOSFET source terminals themselves which are connected to the unregulated supply rails. As a result, when gate bias is derived from a circuit point wherein its potential is stable with respect to ground, any change in the supply rail potential will cause a corresponding change in the applied gate-source potential. Regulation of said supply rails would be an unsatisfactory approach for it would require expensive, high power components.

The ideal solution arose from the realization that bias for each MOSFET gate can be derived from a point whose potential exhibits the same instability with respect to circuit ground as does the supply rail potential itself. This would in effect "balance" the gate and source bias point so that any change in power supply potential would not affect the potential between the MOSFET gate and the MOSFET source.

Operational amplifiers 167 and 213 are used in the differentiator/summer sectors 5. Device 167 is powered by connecting its positive supply input to the positive fundamental supply rail 19, and its negative supply input to circuit ground 149. Device 213 is powered by connecting its negative supply input to the negative fundamental supply rail 21, and its positive supply input to circuit ground 201. The output of driver amplifier 101 is connected to the non-inverting input of operational amplifier 167 via resistor 145, and to the non-inverting input of operational amplifier 213 via resistor 209. Resistor 147 connects the non-inverting input of operational amplifier 167 to the positive fundamental supply rail 19. Resistor 147 has an ohmic value equal to that of resistor 145. Resistor 211 connects the non-inverting input of operational amplifier 213 to the negative fundamental supply rail 21. Resistor 211 has an ohmic value equal to that of resistor 209.

Adjustable voltage reference device 187 is configured with its negative terminal connected to the negative rail of auxiliary power supply 23 through resistor 163, and its positive terminal connected to the emitter lead of transistor 189. Transistor 189 is an NPN bipolar transistor whose collector and base leads are tied to circuit ground 175. The output potential of adjustable voltage reference device 187 is set by a degenerative feedback network composed of variable resistor 183 and resistor 185. Variable resistor 183 interconnects the negative terminal and adjustment terminal of adjustable voltage reference device 187; fixed resistor 185 ties said adjustment terminal to ground 175. A reference potential is derived at the negative terminal of adjustable reference device 187 and has a negative polarity with respect to circuit ground 175. An inverse reference potential (positive polarity with respect to circuit ground) of equal magnitude is generated by operational amplifier 169. Operational amplifier 169 is powered with its positive supply input terminal 137 connected to the positive rail of auxiliary power supply 23, and its negative supply terminal 139 connected to the negative rail of auxiliary power supply 23. Operational amplifier 169 is disposed with its non-inverting input tied to circuit ground 165, and its inverting input connected to the negative terminal of adjustable voltage reference device 187 via resistor 161. Resistor 159 applies degenerative feedback to operational amplifier 169 by connecting the output terminal of same to its inverting input terminal. Resistor 161 and resistor 159 are of equal ohmic value, hence the inverting gain of operational amplifier 169 is unity.

The positive reference potential which appears at the output of operational amplifier 169 is applied to the inverting input of operational amplifier 167 via resistor 151. Resistor 153 applies degenerative feedback to operational amplifier 167 by connecting the output terminal of same to its inverting input terminal. Resistors 151 and 153 are of equal value, hence the inverting gain of operational amplifier 167 is unity. The negative reference potential appearing at the negative terminal of adjustable voltage reference device 187 is applied to the inverting input terminal of operational amplifier 213 through resistor 203. Resistor 205 applies degenerative feedback to operational amplifier 213 by connecting the output terminal of same to its inverting input terminal. Resistors 203 and 205 are of equal ohmic value, hence the inverting gain of operational amplifier 213 is unity.

The output terminal of operational amplifier 167 is connected to the gate of output device MOSFET 265 through resistor 155 and resistor 157. The output terminal of operational amplifier 213 is connected to the gate of output device MOSFET 267 through resistor 207 and resistor 237. P-channel enhancement mode MOSFET 265 and N-channel enhancement mode MOSFET 267 comprise a common source push-pull output stage 9. The source terminal of MOSFET 265 is connected to the positive fundamental supply rail 19, and the source terminal of MOSFET 267 is connected to the negative fundamental supply rail 21. The drain terminals of MOSFET 265 and MOSFET 267 are interconnected, thus forming the output node.

Observing the positive half of the circuit, if the reference potential were zero volts, and the output potential of driver amplifier 101 were zero volts, the output potential of operational amplifier 167 would rise to its positive limit. This is true because resistors 145 and 147, being of equal ohmic value, apply exactly one-half of the fundamental supply rail potential to the non-inverting input terminal of operational amplifier 167. At said input terminal, the voltage gain of operational amplifier 167 can be observed to be exactly two, since resistors 151 and 153 are of equal ohmic value. Output device MOSFET 265 remains cut off. However, any potential applied to operational amplifier 167 via resistor 151 is algebraically subtracted from the output potential of operational amplifier 167. This is true because the voltage gain of operational amplifier 167 at resistor 151 is exactly negative one. It can be seen, then, that with a positive reference potential of three volts, the output potential of operational amplifier 167 will be exactly three volts less than the fundamental supply rail potential, regardless of the magnitude of supply potential.

Any potential impressed on resistor 145 by the output terminal of driver amplifier 101 will be divided exactly in half when it reaches the non-inverting input terminal of operational amplifier 167. Said potential will be summed with the existing potential at said input terminal. Furthermore, a modulating voltage at the output of driver amplifier 101 will be divided by two and will, at that amplitude, modulate the existing potential at the non-inverting input of operational amplifier 167. Since it was earlier stated that operational amplifier 167 exhibits a voltage gain of two at said input, it can be seen that an audio signal impressed on the circuit by the output terminal of driver amplifier 101 will appear at its original amplitude at the gate terminal of MOSFET 265, where it will modulate the existing gate potential. Hence, a signal path exhibiting a voltage gain of positive one is established from the output terminal of driver amplifier 101 to the gate terminal of output device MOSFET 265.

Observing now the negative half of the circuit, if the reference potential were zero volts, and the output potential of driver amplifier 101 were zero volts, the output potential of operational amplifier 213 would rise to its negative limit. This is true because resistor 209 and 211, being of equal ohmic value, apply exactly one-half of the fundamental supply rail potential to the non-inverting input terminal of operational amplifier 213. At said input terminal, the voltage gain of operational amplifier 213 can be observed to be exactly two, since resistors 203 and 205 are equal ohmic value. Output device MOSFET 267 remains cut off. However, any potential applied to operational amplifier 213 via resistor 203 is algebraically subtracted from the output potential of operational amplifier 213. This is true because the voltage gain of operational amplifier 213 at resistor 203 is exactly negative one. It can be seen, then, that with a negative reference potential of three volts, the output potential of operational amplifier 213 will be exactly three volts less than the fundamental supply rail potential, regardless of the magnitude of supply potential.

Any potential impressed on resistor 209 by the output terminal of driver amplifier 101 will be divided exactly in half when it reaches the non-inverting input terminal of operational amplifier 213. Said potential will be summed with the existing potential at said input terminal. Furthermore, a modulating voltage at the output of driver amplifier 101 will be divided by two and will, at that amplitude, modulate the existing potential at the non-inverting input of operational amplifier 213. Since it was earlier stated that operational amplifier 213 exhibits a voltage gain of two at said input, it can be seen that an audio signal impressed on the circuit by the output terminal of driver amplifier 101 will appear at its original amplitude at the gate terminal of MOSFET 267, where it will modulate the existing gate potential. Hence, a signal path exhibiting a voltage gain of positive one is established from the output terminal of driver amplifier 101 to the gate terminal of output device MOSFET 267.

Driver amplifier 101 does not interfere with bias regulation because it is not able to modulate the output potentials of operational amplifier 167 and 213 in directions of opposing polarity. That is, driver amplifier 101 controls only the distribution of gate bias potentials; the combined total gate-source potentials of MOSFETs 265 and 267 does not change.

Bias regulation is far more stable in the present invention that in other designs. This is true because the bias stability of the latter is dependent on the linearity of the driver transistors, which are usually bipolar devices. By looking at the output characteristics of a bipolar transistor, one would see that the linear section of the graph exhibits a greater than zero slope and is hence an imperfect means of regulating current.

Instead of using a single reference device and providing a means for inverting the polarity of its output potential, two reference devices could have been used. However, varying the reference potential is a convenient method of adjusting the MOSFET idle current. Using a single reference device allows a single variable resistor 183, to bias the MOSFETs symmetrically. Hence, adjustment of said control will not cause the output potential of driver amplifier 101 to move towards its limits in an effort to balance a given control setting. This insures that the headroom of driver amplifier 101 will not be restricted. Furthermore, the single reference design allows transistor 189 to bias the MOSFETs symmetrically as well. Transistor 189 is mounted to the heat sink along with MOSFETs 265 and 267 to stabilize output stage idle current against temperature changes. The emitter-base potential of transistor 189 is effectively added to the reference potential generated by adjustable voltage reference device 187; its negative temperature coefficient causes it to reduce the total reference potential as the heat sink temperature rises. When a single reference potential device and inverter operational amplifier are used, the bipolar transistor (such as transistor 189) is an NPN bipolar transistor. However, when two reference devices are used, temperature compensation for each MOS device is handled separately, using two separate compensation components, such as one NPN bipolar transistor and one PNP bipolar transistor.

The signal path provided by differentiator/summer sectors 5 would seem adequate as is, eliminating the need for coupling capacitors entirely. However, instability and output stage destruction would result. Operational amplifiers 167 and 213 are devices with a high open loop gain factor; they use degenerative feedback paths to linearize their transfer functions. The interelectrode capacitances of MOSFETs 265 and 267 exhibit values which are dependent upon the interelectrode potentials. Since the devices operate out of phase, their capacitances are never of equal quantity when a drive signal is applied. The interelectrode capacitances of MOSFETs 265 and 267 are effectively paralleled by capacitors 221 and 223; they act as a single load. However, acting as separate loads on the output terminals of operational amplifiers 167 and 213, said interelectrode capacitances cause devices 167 and 213 to operate out of phase with one another. When overall degenerative feedback is applied to the present invention amplifier 1, driver amplifier 101 attempts to linearize the transfer function of same by monitoring the signal at the output stage drain node and applying a corrective signal to differentiator/summer sectors 5. However, excitation of driver amplifier 101 is prompted from a single point, the output node. This single-point output node defines the phase of the corrective signal which will be posed by driver amplifier 101, and occurs without regard to the fact that the gates of the output devices are out of phase. That is, a response from driver amplifier 101 prompted by the collective action of operational amplifiers 167 and 213, will exhibit a phase of a regenerative nature with respect to, say, operational amplifier 213, since it is either leading or lagging operational amplifier 167 with respect to phase. Said devices are thus forced into an unstable region of operation and oscillate. During oscillation, the asynchronous operation of devices 167 and 213 cause an overlap in the conduction of MOSFETs 265 and 267, destroying the output stage. This anomaly is purely a high frequency phenomenon, hence the use of coupling capacitors 221 and 223 stabilizes the present amplifier 1 by synchronizing the drive signals applied to MOSFETs 265 and 267. Furthermore, capacitors 221 and 223 can be referred to as strictly stabilization capacitors, since their presence does not pose a phase shift/roll-off characteristic on the transfer function of the present amplifier 1.

Capacitor 221 is connected from the output of driver amplifier 101 to the gate device MOSFET 265 through resistor 157. Capacitor 223 is connected from the output of driver amplifier 101 to the gate of output device MOSFET 267 through resistor 237. Capacitors 221 and 223 establish a high-frequency path from the output of driver amplifier 101 to the gates of the output devices.

Resistors 157 and 237 are of low ohmic value and are included for the purpose of stabilizing the output stage against radio frequency oscillation. Zener diode pair 261 is connected across the gate and source terminals of MOSFET 265, and zener diode pair 263 is connected across the gate and source terminals of MOSFET 267. These bi-directional common-anode diodes prevent excessive drive signals from destroying the output.

Resistor 155 forms a band pass filter with capacitor 221, and resistor 207 forms a band pass filter with capacitor 223; said filters determine the crossover frequency between differentiator/summer sectors 5 and A. C. signal sectors 7 in the respective positive and negative halves of the amplifier circuit.

Degenerative feedback is applied to driver amplifier 101 through resistor 107, connected between the drain node of the output stage and the non-inverting terminal of driver amplifier 101. Resistor 109 is connected between said input terminal and circuit ground 111. (Since the common source output configuration acts as an inverter, the inputs of driver amplifier 101 are functionally reversed, so the non-inverting input of driver amplifier 101 serves as the inverting input of the present amplifier 1.) To stabilize the present amplifier 1 against regeneration, capacitor 105 is connected in parallel with 107.

A series network comprised of resistor 271 and capacitor 273 is placed between the output node and ground 277 to prevent oscillation. A parallel network composed of resistor 269 and air core inductor 275 is placed in series with the amplifier output terminal 17. Said network guarantees stability when driving reactive loads.

An optional servo-controlled offset null circuit 13 of the conventional type is depicted in FIG. 2. The purpose of such a circuit is to nullify any D. C. potential appearing at the output terminal of the host amplifier without the need for manual adjustment. Capacitors 89, 91, resistors 93, 71, and operational amplifier 103 form an integrator. (While operational amplifier 103 and operational amplifier 169 are shown separately in FIG. 2, it should be noted that they are preferably sections of a single, commercially available device and thus receive power from auxiliary power supply 23. If, in less preferred embodiments, they are physically separate, then operational amplifier 103 should be understood to be connected to the auxiliary power supply rails.) Resistor 93 is connected between the drain node of the output stage and the non-inverting input terminal of operational amplifier 103. A low pass filter is formed at said input by coupling same to circuit ground via capacitor 91. A degenerative feedback path is established about operational amplifier 103 by interconnecting the output terminal and the inverting input terminal of same via capacitor 89. A high pass filter is formed at said input by coupling same to circuit ground 69 via resistor 71. Capacitors 89 and 91 are of equal capacitance and resistors 71 and 93 are of equal ohmic value. Hence the low pass filter at the non-inverting input terminal of operational amplifier 103 exhibits a roll-off frequency equal to that of the high pass filter at the inverting input of same. The output terminal of operational amplifier 103 applies a cancellation voltage to offset null terminal 8 of driver amplifier 101 via resistor 67. Offset null terminal 1 of driver amplifier 101 is tied to circuit ground 69 through resistor 73. The use of optional servo 13 eliminates the need for a blocking capacitor at the input terminal of the host amplifier.

While the present invention is described relative to an audio amplifier circuit, it should be noted that this amplifier circuit could be used in other embodiments beside audio. Thus, in an industry where vibrational testing is used and a large frequency band is utilized, the present amplification circuit may well be advantageous over the present state-of-the-art.

Obviously, numerous modifications and variations of the present invention are possible in light of the above teachings. It is therefore understood that within the scope of the appended claims, the invention may be practiced otherwise than as specifically described herein.

What is claimed is:

1. An amplifier circuit for connection to an input source and to one or more output devices, such as one or more speakers, which comprises:
    (a) input amplifier;
    (b) positive power supply input;
    (c) negative power supply input;
    (d) a first bias input means;
    (e) a second bias input means;
    (f) a first differentiator/summer, receiving signals from said input amplifier, receiving signals from said positive power supply input and receiving signals from said first bias input means;
    (g) a second differentiator/summer, receiving signals from said input amplifier, receiving signals from said negative power supply input and receiving signals from said second bias input means;
    (h) a PMOS device, receiving signals from said first differentiator/summer, receiving power from said positive power supply input and receiving signals from a first A. C. signal path set forth below;
    (i) an NMOS device, receiving signals from said second differentiator/summer, receiving power from said negative power supply input and receiving signals from a second A. C. signal path set forth below;
    (j) a first A. C. signal path, receiving signals from said input amplifier and sending resultant signals to said PMOS device;
    (k) a second A. C. signal path, receiving signals from said input amplifier and sending resultant signals to said NMOS device; and,
    (l) an output terminal receiving signals from said PMOS device and said NMOS device;

wherein said first differentiator/summer and said second differentiator/summer act to assure that the gate tracks the source of the PMOS device and that the gate tracks the source of the NMOS device respectively so that the respective gate-source potentials of the PMOS device and the NMOS device are unaffected by changes in the potential of the power supply, and act to send signals to the PMOS device and the NMOS device respectively only upon potential differences in signals between the bias input means and the input amplifier signals, and act to maintain an idle bias, as desired; and, wherein said first A. C. signal path and said second A. C. signal path provide parallel paths to said PMOS device and said NMOS device respectively to bypass said differentiator/summers, when signals from said input amplifier exceed a preset frequency.

2. The amplifier circuit of claim 1 wherein each of said differentiator/summers include at least one operational amplifier.

3. The amplifier circuit of claim 1 wherein said PMOS device and said NMOS device are MOSFET devices.

4. The amplifier circuit of claim 1 wherein said bias input means includes at least one bias generator having a single reference potential device.

5. The amplifier circuit of claim 4 wherein said bias generator includes a single reference potential device and an inverter operational amplifier.

6. The amplifier circuit of claim 4 wherein said bias generator includes two reference potential devices.

7. The amplifier circuit of claim 4 wherein an adjustable resistor is included in said bias generator for manual adjustment of bias potentials.

8. The amplifier circuit of claim 5 wherein an adjustable resistor is included in said bias generator for manual adjustment of bias potentials.

9. The amplifier circuit of claim 6 wherein at least one adjustable resistor is included in said bias generator for manual adjustment of bias potentials.

10. The amplifier circuit of claim 4 wherein said bias generator includes at least one transistor for bias potential adjustment responsive to temperature changes of the MOS devices.

11. The amplifier circuit of claim 5 wherein said bias generator includes at least one transistor for bias potential adjustment responsive to temperature changes of the MOS device.

12. The amplifier circuit of claim 6 wherein said bias generator includes at least two transistors for bias potential adjustment responsive to temperature changes of the MOS devices.

13. The amplifier circuit of claim 10 wherein said transistor is an NPN bipolar transistor.

14. The amplifier circuit of claim 12 wherein said transistors include at least one NPN bipolar transistor and at least on PNP bipolar transistor.

15. The amplifier circuit of claim 1 wherein said A. C. signal paths include capacitors which protect the PMOS device and NMOS device against simultaneous conduction by synchronizing the signals applied thereto and which exclude D. C. signals therefrom.

16. The amplifier circuit of claim 2 wherein said A. C. signal paths include capacitors which protect the PMOS device and NMOS device against simultaneous conduction by synchronizing the signals applied thereto and which exclude D. C. signals therefrom.

17. The amplifier circuit of claim 1 wherein said PMOS and said NMOS devices include zener diodes connected thereto so as to limit excessive gate signals thereto.

18. The amplifier circuit of claim 2 wherein said PMOS and said NMOS devices include zener diodes connected thereto so as to limit excessive gate signals thereto.

19. The amplifier circuit of claim 1 wherein said circuit further includes an optional servo-controlled offset null circuit.

20. The amplifier circuit of claim 2 wherein said circuit further includes an optional servo-controlled offset null circuit.

* * * * *